(12) United States Patent
Tsironis

(10) Patent No.: US 8,497,745 B1
(45) Date of Patent: Jul. 30, 2013

(54) VHF HARMONIC IMPEDANCE TUNER

(76) Inventor: Christos Tsironis, Kirkland (CA)

( * ) Notice: Subject to any disclaimer, the term of this patent is extended or adjusted under 35 U.S.C. 154(b) by 145 days.

(21) Appl. No.: 13/180,796

(22) Filed: Jul. 12, 2011

(51) Int. Cl.
*H03H 7/38* (2006.01)
(52) U.S. Cl.
USPC ............................................ 333/32; 333/17.3
(58) Field of Classification Search
USPC .................................... 333/32, 33, 17.3, 263
See application file for complete search history.

(56) References Cited

U.S. PATENT DOCUMENTS

| | | | |
|---|---|---|---|
| 5,034,708 A | 7/1991 | Adamian et al. | |
| 6,297,649 B1 | 10/2001 | Tsironis | |
| 7,646,267 B1 | 1/2010 | Tsironis | |
| 7,646,268 B1 | 1/2010 | Tsironis | |

OTHER PUBLICATIONS

ATN Microwave Inc., "A Load Pull System with Harmonic Tuning", Microwave Journal, Mar. 1996.
"MPT, a Universal Multi-Purpose Tuner", Focus Microwaves inc., Product Note # 79, Oct. 2004.

*Primary Examiner* — Stephen Jones

(57) ABSTRACT

An electro-mechanical VHF harmonic load pull tuner is made as a cascade of three independent tuning sections, each including three adjustable shunt air capacitors inter-connected using coaxial cables of appropriate length, or one section of nine shunt capacitors inter-connected using coaxial cables; each capacitor is adjustable to at least 20 values (states); the tuner creates independently controllable impedances at three (harmonic) frequencies in the frequency range between 10 and 150 MHz. An Error Function-based optimization algorithm allows impedance tuning at three frequencies independently, by optimized searching among the more than $20^9 \approx 512,000,000,000$ possible combined tuner states. This allows matching the output of VHF transistors and amplifiers at the fundamental and harmonic frequencies. Stepper motors, drivers and control software are used to automate, calibrate and use the harmonic tuner in an automated harmonic load pull measuring setup.

16 Claims, 15 Drawing Sheets

Load and Source pull measurement setup using VHF harmonic tuners.

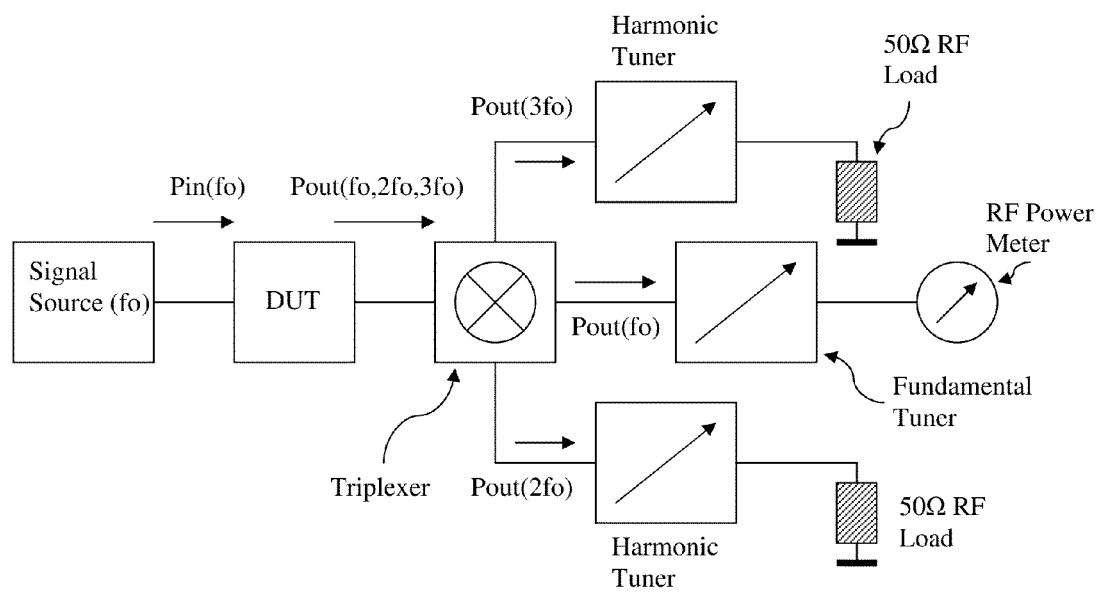
Figure 1: Prior Art, GHz frequency-range harmonic load pull system

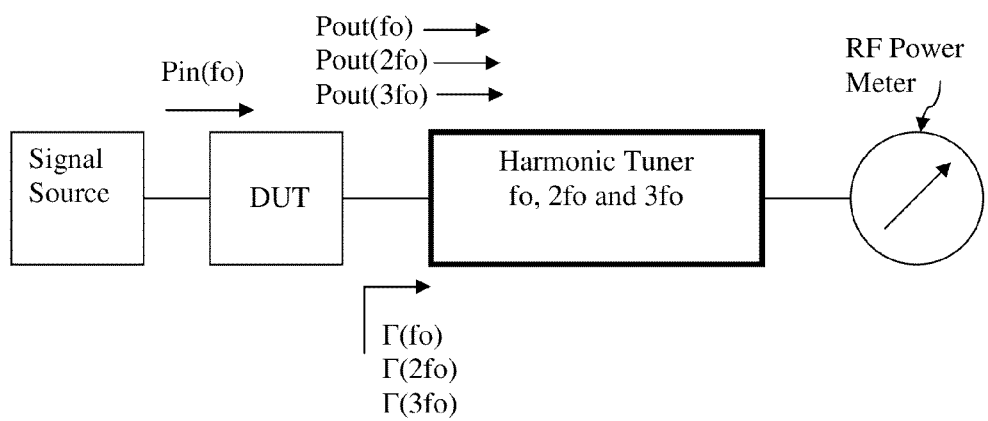
Pin = RF power injected into the DUT
Pout = RF power generated by the DUT
$\Gamma$ = RF reflection factor
Figure 2: Prior Art: GHz frequency range Harmonic load pull system using harmonic tuner.

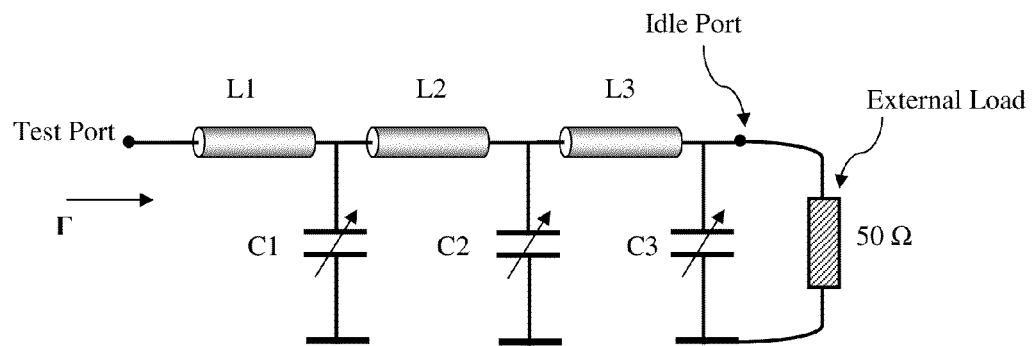
Figure 3: Prior Art, Low frequency impedance tuner.

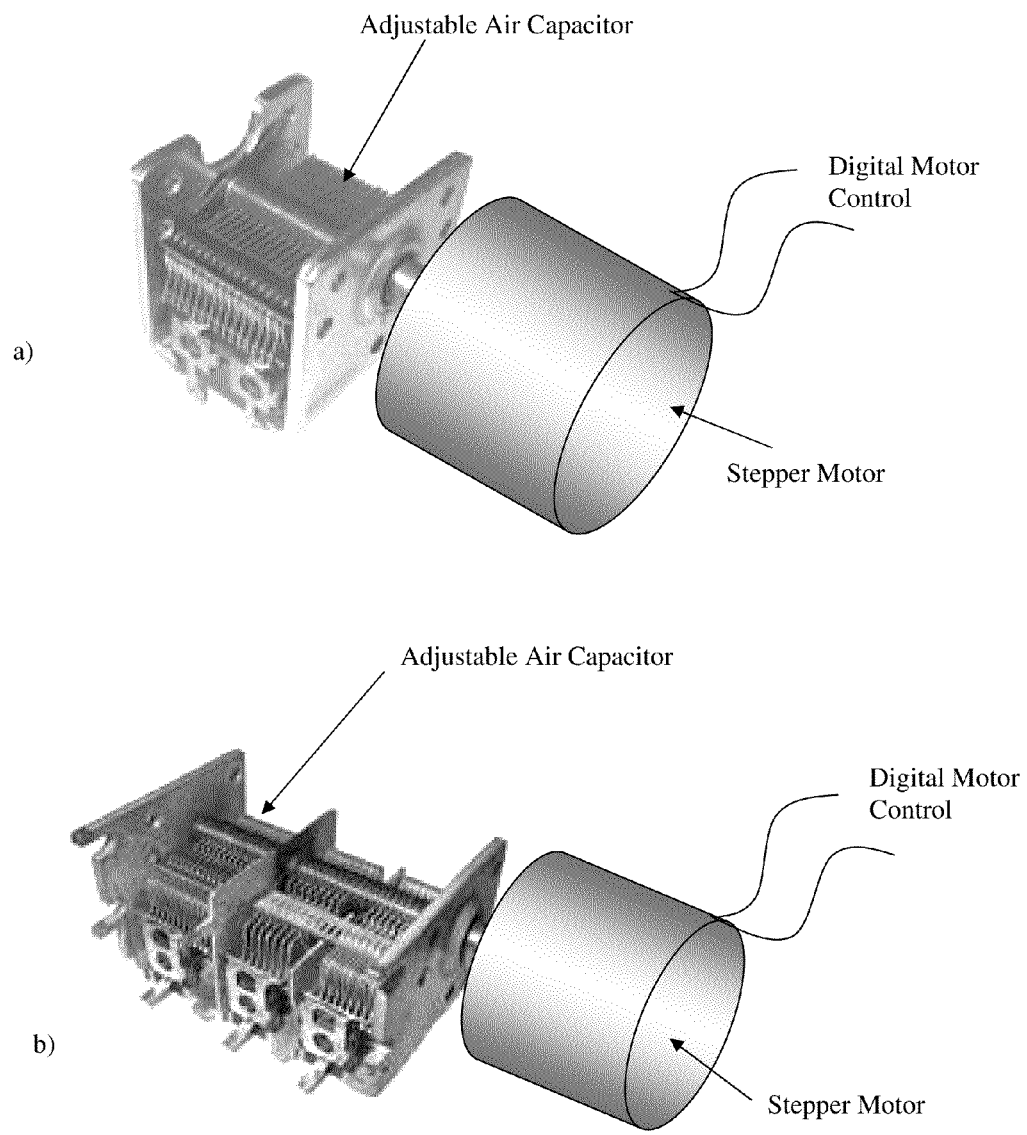
Figure 4: Prior art, variable air capacitors controlled by stepper motors

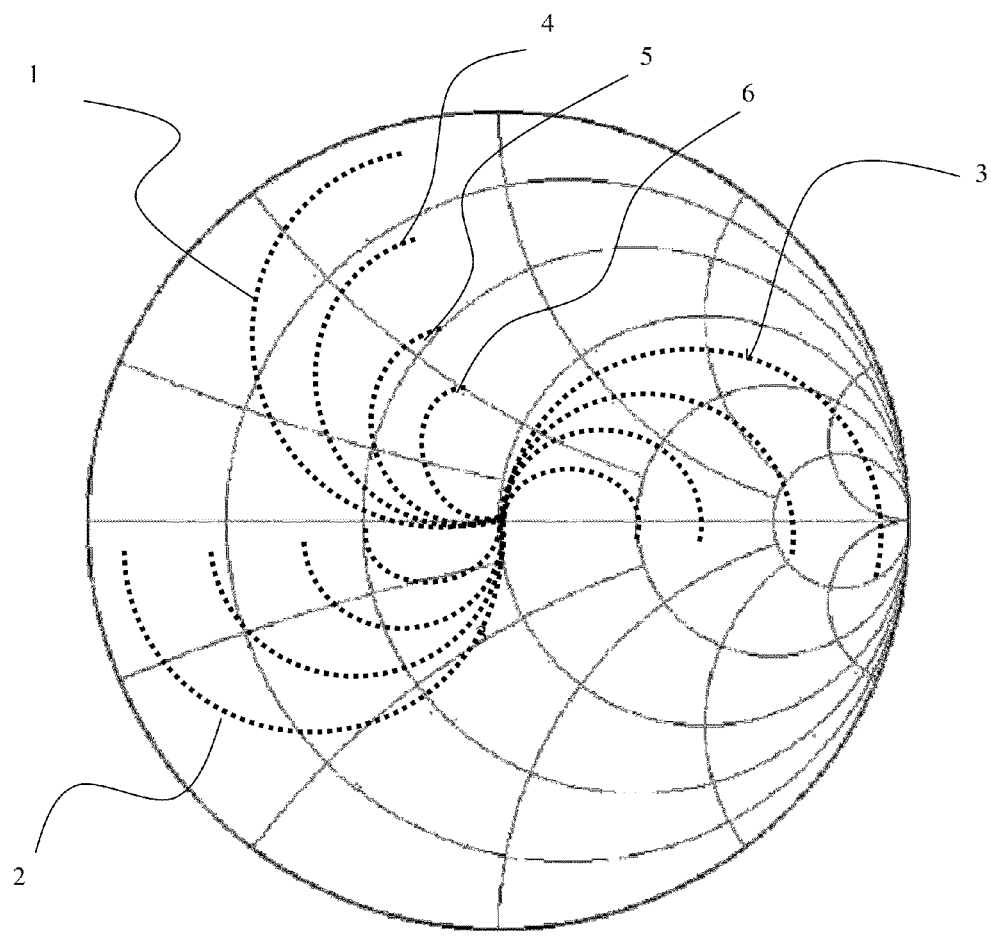
Figure 5: Prior art, reflection factor as a function of variable shunt capacitances and lengths of cable.

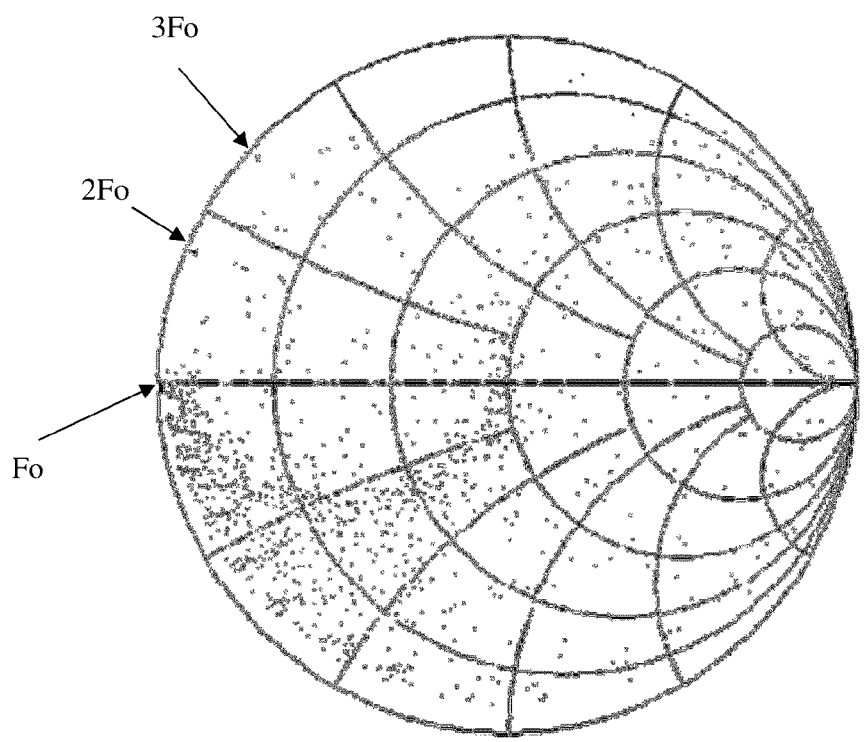
Figure 6, Prior art: Distribution of 1000 calibration points of VHF tuner shown at Fo=40MHz.

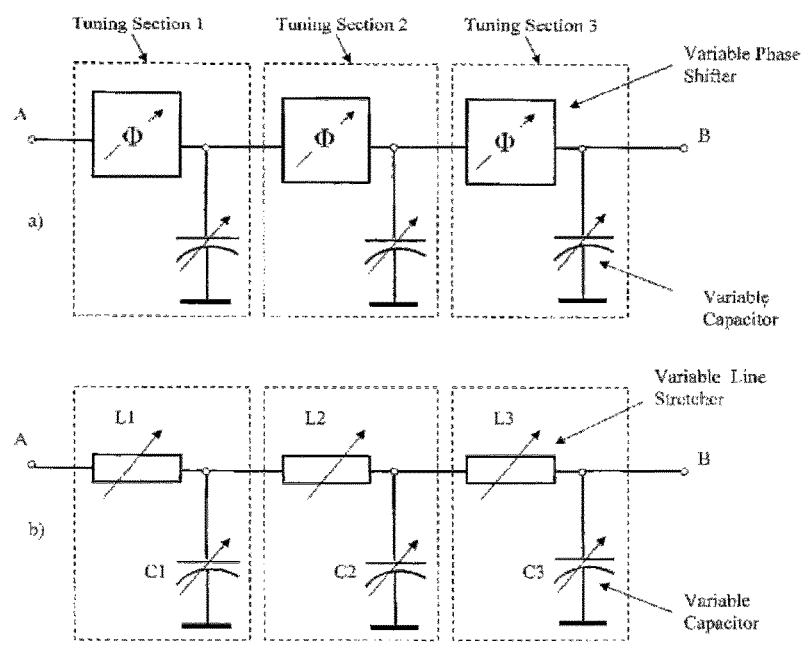
Figure 7, prior art: Low Frequency harmonic tuner.

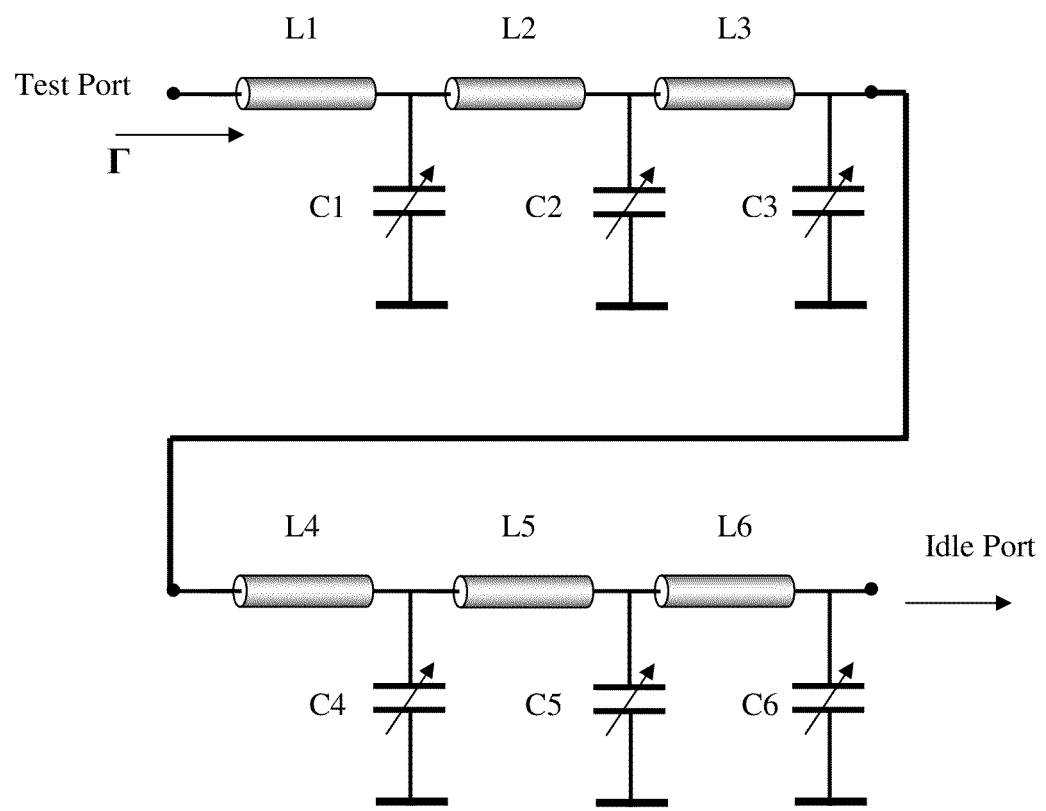
Figure 8: VHF tuner for 2 frequency/harmonic tuning

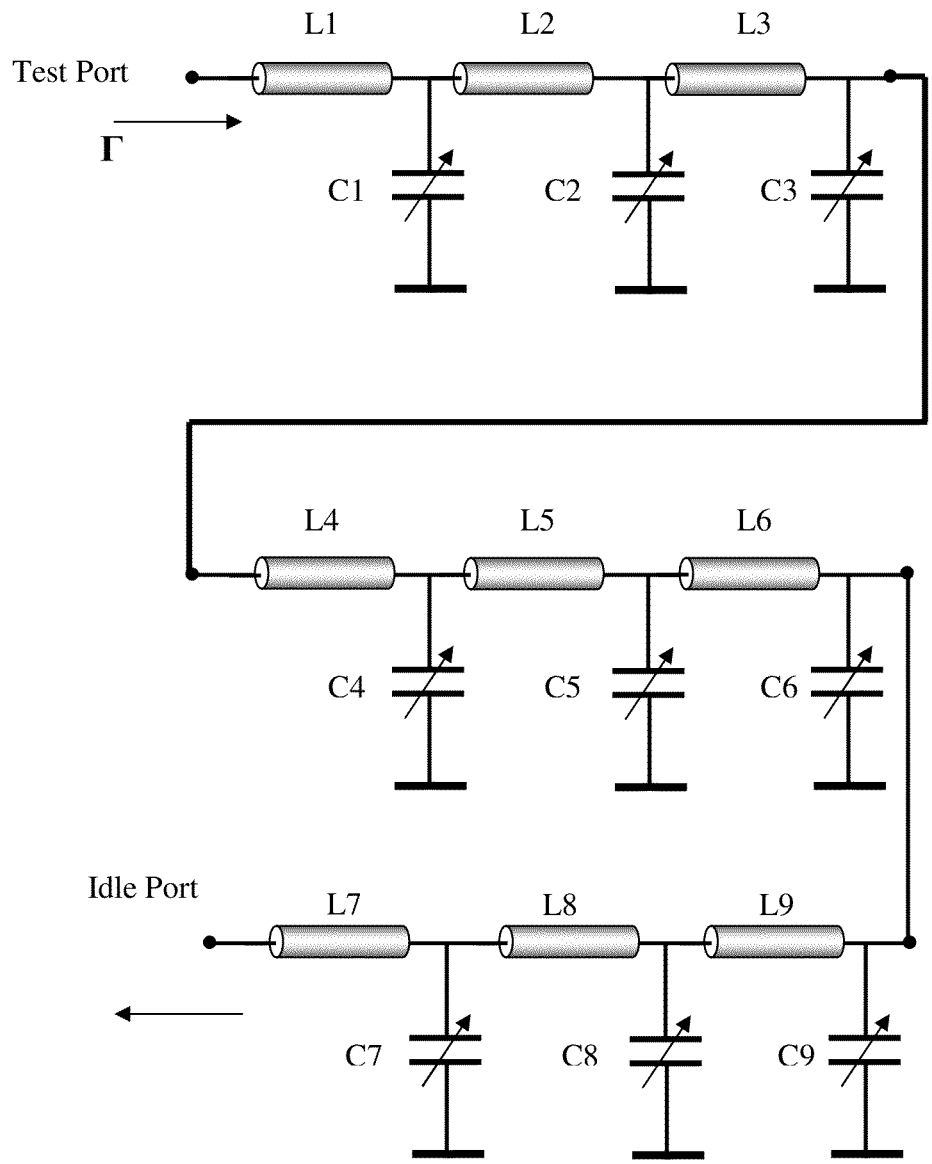
Figure 9: VHF tuner for 3 frequency/harmonic tuning

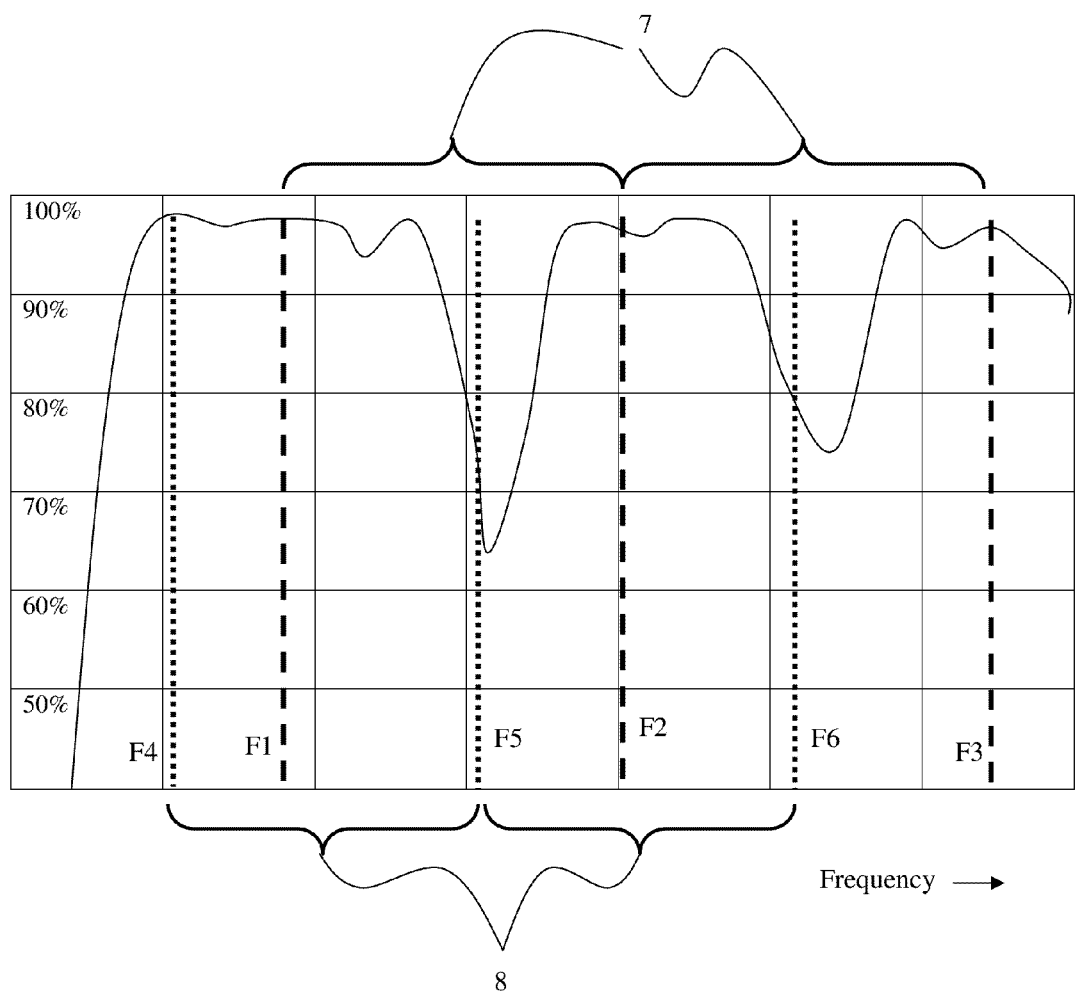
Figure 10: Smith chart coverage (%) of 3 capacitor tuning sections

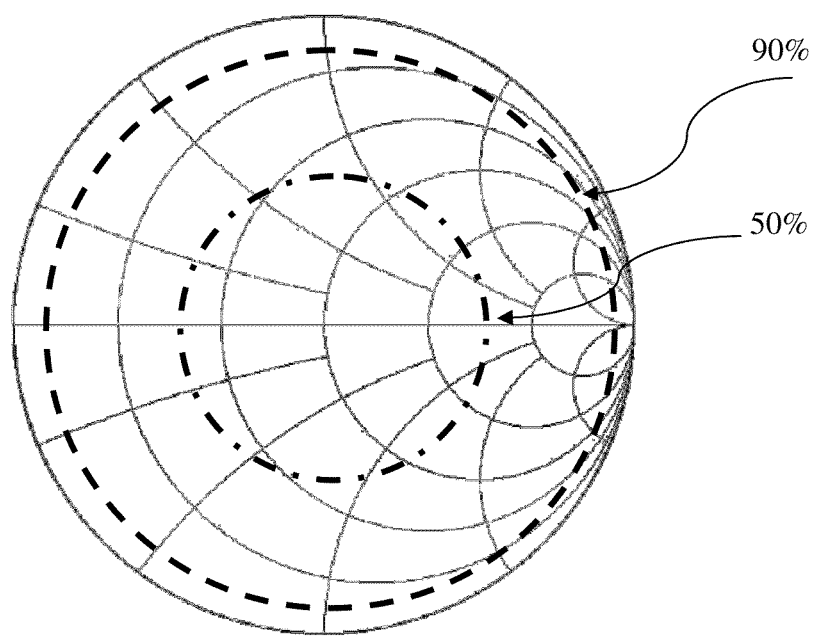
Figure 11: Definition of Smith chart coverage (%).

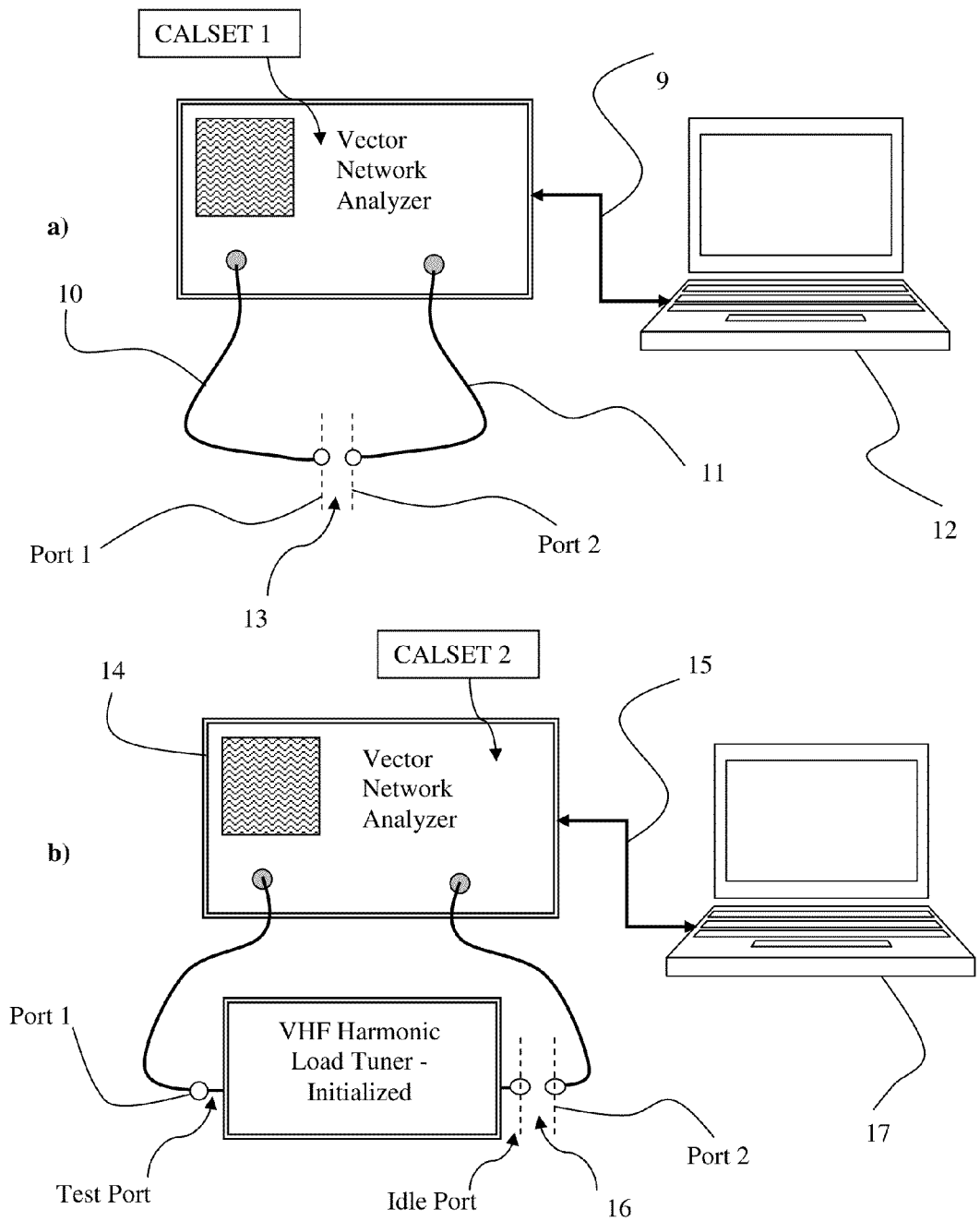
Figure 12: Calibrating the Vector Network Analyzer (VNA).

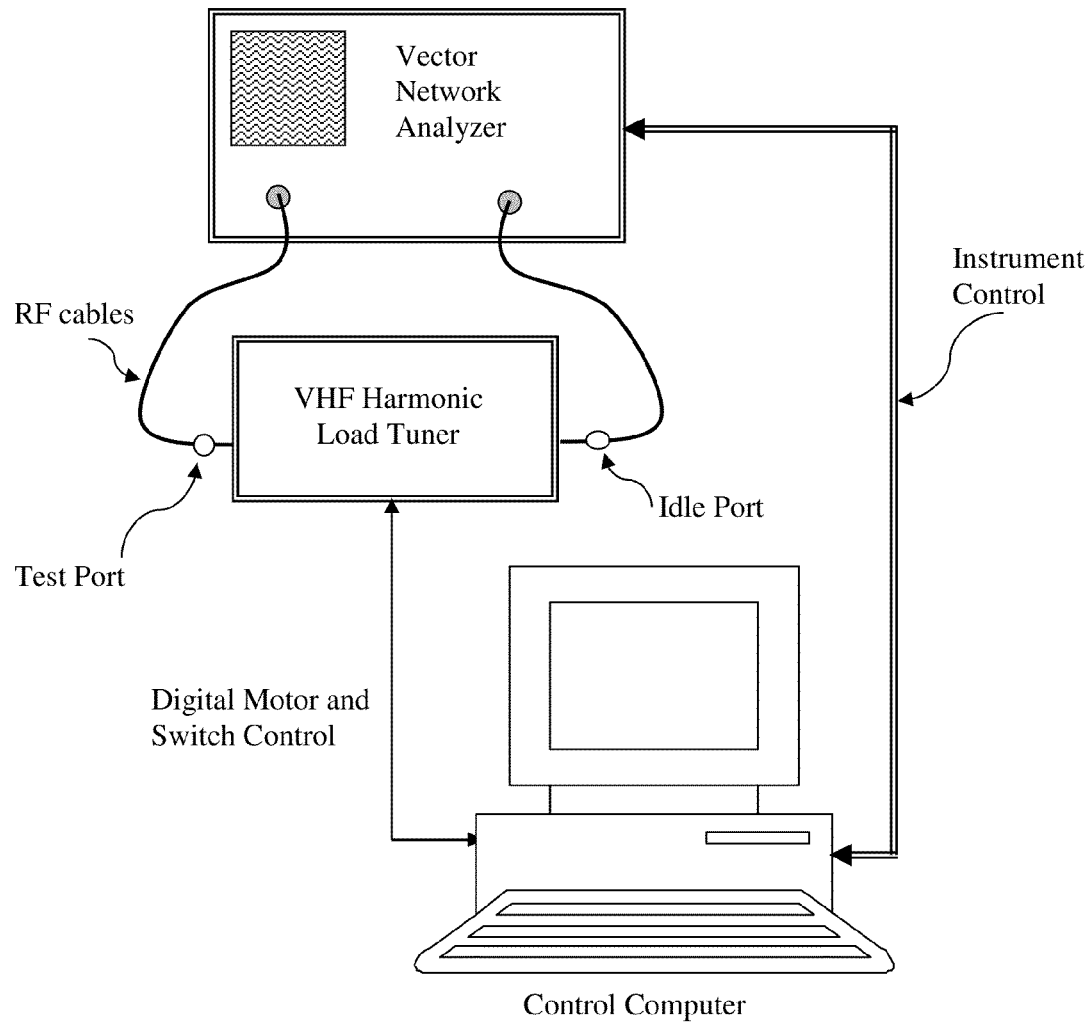
Figure 13: Setup for calibrating the VHF harmonic tuner.

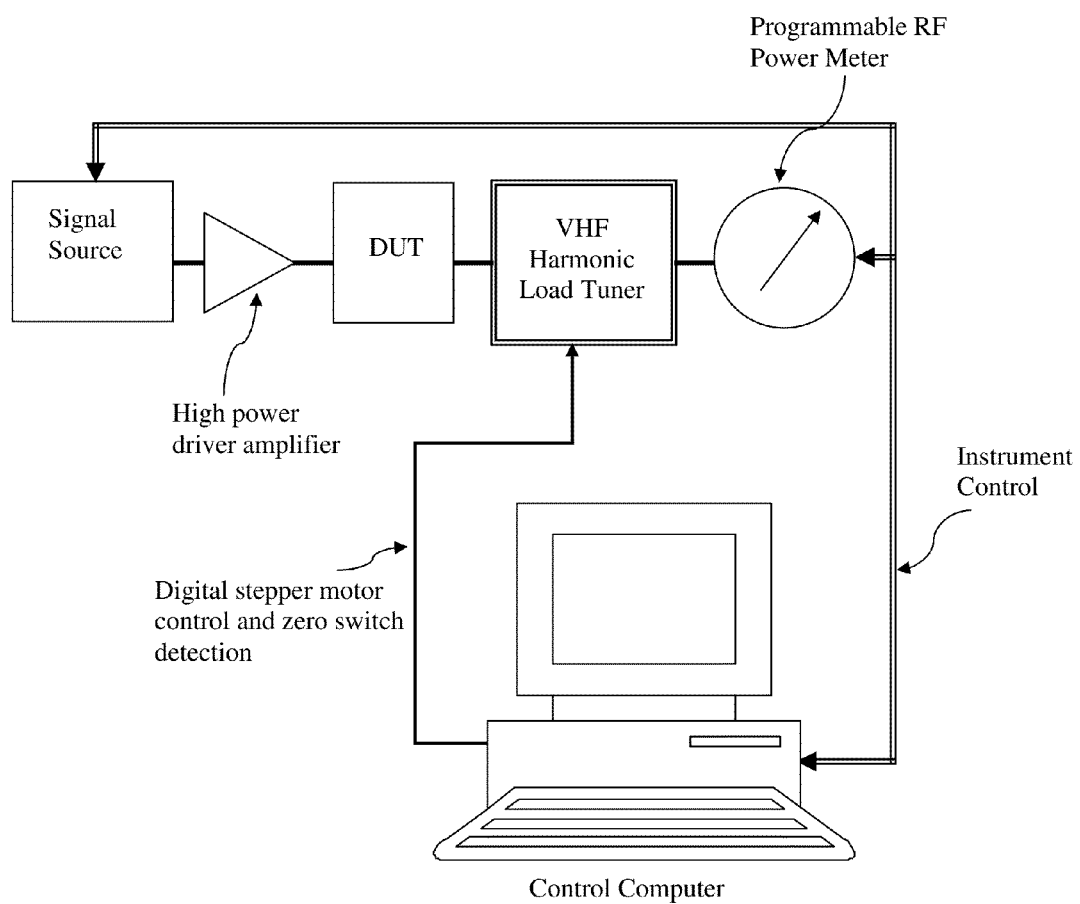
Figure 14: Load pull measurement setup using a VHF harmonic load tuner.

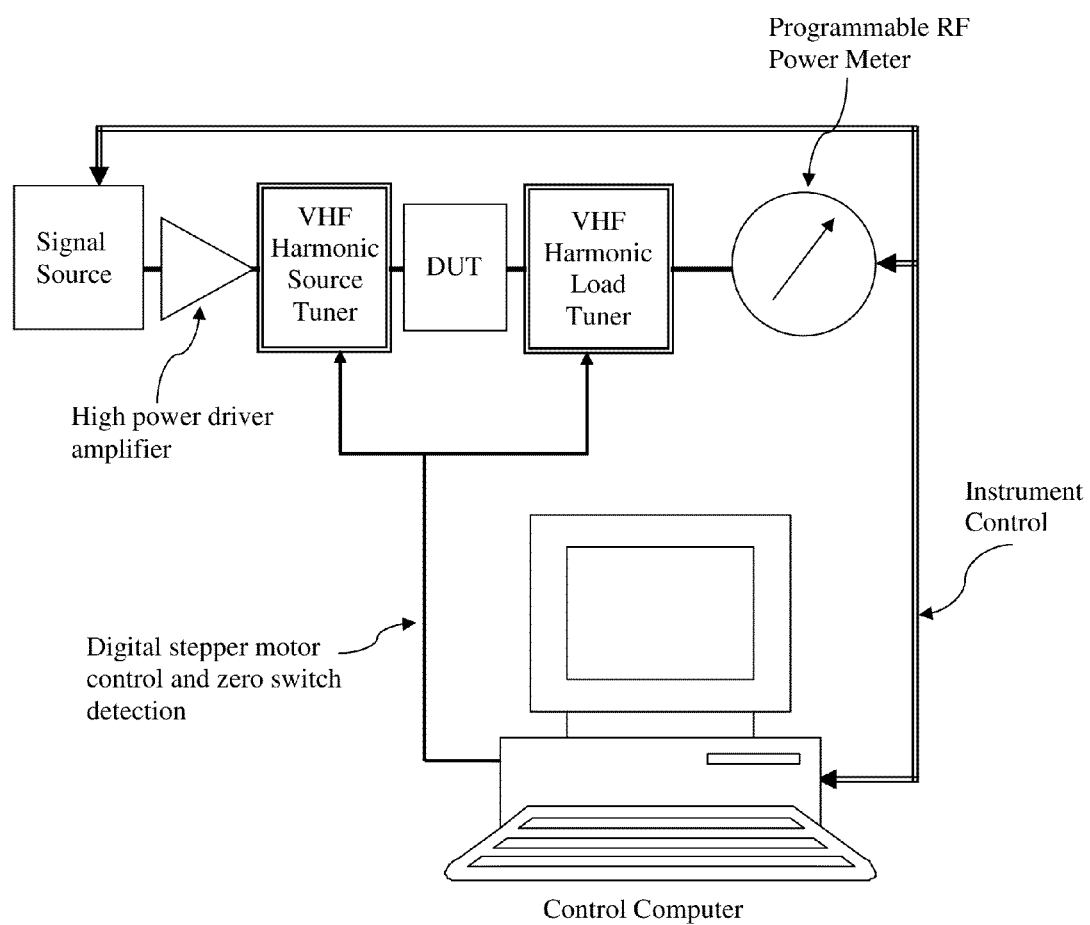
Figure 15: Load and Source pull measurement setup using VHF harmonic tuners.

VHF HARMONIC IMPEDANCE TUNER

PRIORITY CLAIM

Not Applicable

CROSS-REFERENCE TO RELATED ARTICLES

[1] Tsironis, U.S. Pat. No. 7,646,267, Low frequency electro-mechanical impedance tuner.
[2] Adamian et al. U.S. Pat. No. 5,034,708, Programmable broadband electronic tuner.
[3] Tsironis, U.S. Pat. No. 7,646,268, Low frequency harmonic load pull tuner and method.
[4] Tsironis, U.S. Pat. No. 6,297,649, Harmonic rejection load tuner, FIG. 6.
[5] Simplex algorithm, http://en.wikipedia.org/wiki/Simplex_algorithm.
[6] ATN Microwave Inc., "A Load Pull System with Harmonic Tuning", Microwave Journal, March 1996.
[7] "MPT, a Universal Multi-Purpose Tuner", Focus Microwaves inc., Product Note #79, October 2004.
[8] "iLFT-028009 Low Frequency Tuner", www:focus-microwaves.com, Literature/Data Sheets.
[9] "Application Notes: Tuning Varactors", Aeroflex Microelectronics Solutions, Revision Date Apr. 13, 2009, www.aeroflex.com/ams/Metelics/pdfiles/AN_TV.pdf.
[10] "Microwave Sapphire PISTONCAP® Trimmer Capacitors Type L—Horizontal Surface Mount", http://www.spraguegoodman.com/207/2071.html.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of VHF frequency transistors and amplifiers, at frequencies typically between 10 MHz and 150 MHz, under high power operating conditions, using automatic impedance tuners in order to synthesize impedances at the input and output of the test devices (DUT) at the fundamental and various harmonic frequencies.

Load Pull is a measurement technique, in which the source or load impedance of a DUT (typically a power RF transistor) is changed systematically using pre-calibrated impedance tuners. This technique is popular at frequencies in the GHz frequency range but unknown in the VHF frequency range, especially below 100 MHz.

Accurate design of high power amplifiers, oscillators and other active components used in various communication systems requires accurate knowledge of the active device's (RF transistor's) characteristics under high power operation conditions. In such circuits, it is insufficient and inaccurate to describe transistors, operating at high power in their highly non-linear regions close to saturation, using analytical or numerical models only. Instead the transistors need to be characterized using specialized test setups under the actual operating conditions.

A popular method for testing and characterizing such components (transistors) under high power operation conditions has been developed at much higher frequencies in the GHz frequency range, as "load pull" and "source pull". Load pull or source pull are measurement techniques employing RF impedance tuners and other RF test equipment, such as RF signal sources and RF power meters. Since transistors are typically used close to power saturation conditions in high efficiency amplifiers, their internal nonlinearities create harmonic frequency components. Those components, if not presented with the appropriate RF impedance will degrade the performance of the amplifier. In order to determine the proper RF impedance a Harmonic Load Pull system is required. In such a system certain components such as frequency discriminators (Diplexers or Triplexers) are used, whose task is to separate the harmonic components generated by the DUT into different paths, where they can be treated separately (FIG. 1). Harmonic impedance tuners [4] are also used in order to manipulate the harmonic microwave impedances presented to and under which the Device under Test (DUT, amplifier or transistor) is tested (FIG. 2).

FIG. 1 shows a setup using a frequency diplexer or triplexer in order to create three independent frequency paths, loaded each with a wideband tuner. This concept of harmonic tuning is well known in the literature and is valid for all frequencies for which appropriate components such as tuners and diplexers/triplexers exist. Because of lack of such components harmonic load pull test systems are not known for frequencies below 800 MHz. This, on the other hand is due to the difficulty in manufacturing such components because of their required size to handle low frequencies and large wavelengths.

A simpler solution for a harmonic load pull test system will use a single multi-harmonic tuner [7], i.e. a tuner which allows independent tuning at harmonic frequencies without using frequency discriminators, such as diplexers and triplexers. Such a setup is shown in FIG. 2.

DESCRIPTION OF PRIOR ART

Electro-mechanical low frequency tuners have been disclosed in [1]; they are made using variable rotary shunt capacitors (C1, C2, C3 in FIG. 3 and FIG. 4) and fixed lengths of coaxial cable between them (L1, L2, L3 in FIG. 3). The capacitors are driven by electrical motors, best suited are stepper motors, because they define precisely the angle of the rotating capacitor blades. By using capacitors of various maximum values and varying each of them between its minimum and maximum values the reflection factor Γ (FIG. 3) describes an arc on the Smith Chart (FIG. 5). The various sets of traces (1, 2 and 3) are created when various lengths of cable (L1, L2, and L3 in FIG. 3) are inserted between the capacitors. The various traces within each set (4, 5 and 6) are created by the same capacitor at different frequencies. As the frequency changes those shapes change as well, since both the actual impedance value of the capacitors change with frequency as do the electrical lengths of the cables. The result is a quasi total reflection factor coverage for each specific frequency (FIG. 6) as a function of the settings of the shunt capacitors. In this specific case (FIG. 6) each of the three capacitors has been adjusted to 10 values and the permutation of all three yields 1000 tuner settings, as shown. The effect is similar at the harmonic frequencies as well, as marked by 2Fo and 3Fo in FIG. 6.

Harmonic VHF load pull impedance tuners have been disclosed in [2]; they comprise three variable shunt capacitors connected between them with variable phase shifters/line stretchers (FIG. 7) and are able to create and adjust reflection factors at a fundamental frequency (Fo) and one or two harmonic frequencies (2Fo, 3Fo) independently. In this configuration the line stretchers must be at least Lambda/2 long at le lowest frequency of operation; for example at F=10 MHz this is 15 meters. It is therefore obvious that this configuration is not suitable for such low frequencies.

The alternative solution described here is a harmonic load pull setup, which uses either readily available or reasonably made operational components in the 10 MHz to 250 MHz frequency range, which are combined in such a way as to allow a harmonic tuner to be assembled, calibrated and operated efficiently.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a GHz frequency-range harmonic load pull system.

FIG. 2 depicts prior art, a GHz frequency range harmonic load pull system using an harmonic tuner.

FIG. 3 depicts prior art, a low frequency impedance tuner.

FIG. 4 depicts prior art, variable air capacitors controlled by stepper motors.

FIG. 5 depicts prior art, the reflection factor as a function of variable shunt capacitances and lengths of cable.

FIG. 6 depicts prior art, distribution of 1000 calibration points of VHF tuner shown at Fo=40 MHz.

FIG. 7 depicts prior art, low frequency harmonic tuner.

FIG. 8 depicts a VHF tuner for 2 frequency/harmonic tuning.

FIG. 9 depicts a VHF tuner for 3 frequency/harmonic tuning.

FIG. 10 depicts Smith chart coverage (%) of 3 capacitor tuning sections.

FIG. 11 depicts the definition of Smith chart coverage (%).

FIG. 12 depicts calibrating the Vector Network Analyzer (VNA).

FIG. 13 depicts setup for calibrating the VHF harmonic tuner.

FIG. 14 depicts Load pull measurement setup using a VHF harmonic load tuner.

FIG. 15 depicts Load and Source pull measurement setup using VHF harmonic tuners.

DETAILED DESCRIPTION OF THE INVENTION

A new configuration for a VHF harmonic tuner is described using the general concept of low frequency three-capacitor tuners [1] and but a different approach than low frequency harmonic tuners with three independent tuning sections, each section comprising a variable shunt capacitor and a phase shifter/line stretcher [3]. The tuner in [3] has an important shortcoming: because it operates at low MHz frequencies it requires long phase shifters/line stretchers of at least one half of a wavelength each (1.5 meters at 100 MHz and 15 meters at 10 MHz), which are difficult to manufacture; beyond the hardware itself, computerized control and appropriate calibration and tuning solution search algorithms are required to make the harmonic/multi-frequency tuning possible.

The present apparatus uses three or more tuning sections in order to generate the large amount of combined impedance states that will allow simultaneous and independent tuning at multiple frequencies. Assuming a number of 20 capacitor settings for each capacitor in each of the tuning sections, the total number of combinations of one tuning section, comprising 3 capacitors, is $20^3$=8,000 states for each frequency, harmonic or not. A cascade of two such tuning sections will generate a total of $8,000^2$=64,000,000 states; and a cascade of three such tuning sections will generate a total of $8,000^3$=512,000,000,000 states, for each frequency. If it can be arranged that said impedance states are distributed over most of the area of the Smith chart at each of the frequencies under consideration (harmonic or not) (7) i.e. frequencies F1, F2, F3 in FIG. 10, then it is statistically certain that there will be capacitor value combinations allowing independent impedance synthesis at those said frequencies. This is valid as well for three tuning sections as for two tuning sections [6]. If said coverage is not obtained (8) as shown for frequencies F4, F5, F6 in FIG. 10, then independent multi-frequency (harmonic) tuning will not be possible over the entire Smith chart.

FIG. 11 shows a definition of "Smith chart coverage", as used in this invention. It is an efficient method for asserting the capacity of a multi-section tuner to generate arbitrary independent impedances at various (harmonic or not) frequencies. Said tuning capacity decreases with the corresponding Smith chart coverage.

Variable capacitors are available in many forms, either mechanical (rotary vane capacitors) or electronic form (varactors); variable mechanical capacitors can be controlled by connecting the axis of the moving section to a remotely controlled stepping motor (FIG. 4). Typical stepping motors turn 0.9 to 1.8° per step; this means it takes 200 to 400 steps per 360° revolution; typical mechanically adjustable rotary vane capacitors, as shown in FIG. 4, allow for a 180° turn between minimum and maximum capacitance value. This means that, without any special arrangements each capacitor can be set to between 100 and 200 distinct positions driven by an ordinary stepping motor and associated control software. This, compared with the 10 to 20 states mentioned before, means an increase in available tuner states by a factor between 10 and 20 for each tuning section, or between $10^3$=1,000 and $20^3$=8,000 for the three cascaded sections. This factor is to be multiplied by the $512*10^9$ already tunable points.

The harmonic tuner needs to be calibrated before using it in a load pull setup. Calibration consists in using a network analyzer (VNA, FIG. 12), which has been calibrated separately before, measuring the scattering parameters (s-parameters) of the tuner between its test port and idle port for different states (=motor positions, corresponding to capacitor values), by retrieving the data through the instrument control link by the control computer and saving on disk in sets of s-parameters and associated motor positions, called calibration files. This data are then recalled and used to reproduce the impedance states to be presented to the DUT during testing. The network analyzer must be calibrated before the above operation, using known methods and calibration standards at the test port and idle port reference planes of the tuner.

Since the harmonic tuner has a total of nine independent variable capacitors, which can each be set at a number of states, it is obvious that we have to deal with a very large permutation problem. Assuming a simple scenario of each variable capacitor being set to 20 different values, then the total number of combined states to measure amounts to $20^9$=5.12*$10^{11}$. Typical motor setting and instrument data retrieval time from the VNA being at an average of at least 1 second, the calibration procedure of all tuner settings at one set of frequencies Fo, 2Fo, 3Fo would amount to 16,460 years. In other words, the tuner cannot be calibrated and used this way.

However, it is possible to calibrate the tuner in short time using a "de-embedding" technique. This consists in measuring the s-parameters of the overall tuner twoport between the test port and the idle port for each one-capacitor tuning element, set individually at a number of states (typically 20 or more) and cascading the result of each capacitor, except the first one, with the inverse s-parameter matrix of said initialized tuner two-port (de-embedding), measured under the condition where all capacitors are initialized (set to the lowest capacitance possible). The s-parameter data of each element's calibration, comprising s-parameters associated with the, typically 20, motor positions, are saved in a "calfile" to be processed later. This method is referred to hereby as "de-embedding calibration" (DE-CAL). In that case the total settings to be measured are 9×20=180 and if each measurement event takes 1 second the total measurement time is 3 minutes. Permutations of the s-parameters saved in the calfiles are subsequently generated in the computer memory in a few seconds.

If the overall tuner is made as a dis-connectable cascade of three "three-capacitor" tuner sections then a possible alternative to this calibration method is to disassemble the cascaded tuner, measure the s-parameters of each section separately, using the same "de-embedding calibration" technique for each section and save the data on the hard-disk. Then proceed as outlined below and cascade all data into a combination calibration matrix. This method will work for tuners which can easily be divided in distinct tuning sections and the internal ports between tuning sections can be made accessible; however it is a cumbersome method and the disassembling and re-assembling of RF connections usually creates inaccuracies, RF repeatability problems and measurement errors, it is therefore not a preferred calibration method.

The "de-embedding calibration" technique outlined before consists in collecting s-parameter data through digital cable (15) from the network analyzer (14) into the control computer (17) and numerically processing them (FIG. 12). However the network analyzer (VNA) itself (14) has an internal computer and processing capacity. What the VNA does, in fact, is detect signals at the ends of the RF cables (test ports, Port 1, Port 2) and cascade them with the "error terms" or an "error two-port" between the test ports and its internal signal detectors. This way the measurement reference can be shifted from the signal detectors themselves to the cable test ports (13, 16). In order to calibrate a multi-element tuner this capacity of the VNA can be used to replace the first step of the "de-embedding" calibration (DE-CAL) outlined before. In this case the VNA is calibrated in two steps: in a first step (FIG. 12a) the VNA is calibrated using only the RF cables at the test ports of said cables. The "error terms" are saved in the VNA's memory as CALSET 1. In a second step the test port of the initialized tuner is connected to the end of the RF cable (Port 1) and the idle port of said tuner is forming a new test port (FIG. 12b); the VNA is then calibrated under the same settings and frequencies as before at this new reference plane (16). The new "error terms" are saved in the VNA's memory as CALSET 2. The new "de-embedding" calibration of the VNA, named here "VNA de-embedding calibration" (VNA-DE-CAL) is then used to calibrate the multi-element tuner.

The multi-element tuner comprising N tuning elements (i=1 to N) is calibrated using the VNA-DE-CAL of the VNA as follows: The tuner is connected between the test ports of the VNA cables (FIG. 13). In a first step CALSET 1 is loaded into the VNA active memory and used to correct the measurements; all tuning elements of said tuner are initialized and only element 1 (the element closest to the tuner's test port) is being set at various positions (settings) and the tuner's s-parameters are measured for all settings of element 1, all other elements being initialized, and saved in a file (calfile 1). In a second step CALSET 2 is loaded into the VNA's active memory and used to measure the s-parameters of the other tuning elements 2 to N, one by one; during this measurement only one element is moving and all others are initialized; the s-parameter data of each element (i) are saved in a corresponding file (calfile i). Permutations of the s-parameters saved in the calfiles I, for i=1 to N, are then made in computer memory in a few seconds.

All that has been outlined in the previous paragraphs for the case of a harmonic tuner with nine motors and nine associated variable capacitors (which corresponds to three independent tuning-sections) is directly applicable to the case of a two tuning-sections tuner (six motors and capacitors) or even the more complex four tuning-sections (twelve motors and capacitors). In this last case, of course, computer memory and speed may be a limitation, since the necessary permutations are huge (the equivalent of $20^{12}=4.1*10^{15}$). Techniques and search strategies have been developed though not to use all available data, but to proceed in two steps, i.e. selecting a coarse permutation net first, such as use only 5 or 7 capacitor settings between the minimum and maximum capacitor values (=motor positions), and search first inside this grid, until the impedance search reveals the closest capacitor values, where a solution of the tuning problem exists, and then create permutations in this capacitor value area only, and subsequently proceed with a finer search.

In the case of a 12 capacitor tuner, calibrated at 21 capacitor/motor settings (1 to 21) a two step search approach is used: In a first step we create permutations for settings 1-6-11-16 and 21=5 settings. The permutations matrix includes $5^{12}=2.44*10^8$ combinations, which is a number of data points that can be processed rapidly with a fast duo-core or quad-core computer processor. The first search will yield a set of solutions in the vicinity of, for example, settings "Si" for each of the 12 capacitors (i=1–12). Then, in a second step, we create permutations for the capacitor settings Si−2, Si−1, Si, Si+1, Si+2, for each capacitor. This again amounts to $5^{12}=2.44*10^8$ combinations and the solution obtained will be as accurate as could be expected from a 21-settings calibration (which would require a search in a data block containing $21^{12}=7.36*10^{15}$ data points). This reduces the search time by a factor of approximately 10,000,000.

Since the VHF tuner of this invention can be considered as a cascade of shunt capacitors Ci with series inductors Li the overall impedance of said tuner can be calculated as a series of parallel-series networks as follows: $Y1=j\omega C1$; $Z1=1/Y1+j\omega L1$; $Y2=1/Z1+j\omega C2$; $Z2=1/Y2+j\omega L2$ etc. or in a general form: $Zn=1/Yn+j\omega Ln$ (eq 1); $Yn=1/Zn-1+j\omega Cn$ (eq 2).

The differential $\delta Yi$ of any Yi as a function of the change in a capacitor Ci can be calculated as: $\delta Yi=1/Zi-1+j\omega Ci$ and the differential $\delta Zi$ of any Zi can be calculated as $\delta Zi=-1/(Yi^2*Zi-1)*j\omega\delta Ci$; Even though analytic expressions of such impedances of a cascade of shunt capacitors and series inductors will involve stacked multiplications and divisions by complex numbers, the computer calculations are straight forward, because they are executed in a numerical step-by-step manner and not at once. Using above general equations 1 and 2 said changes can be calculated immediately for any combination of capacitor changes, always starting with the first capacitor. If we consider the whole tuner being a series of Zi, then the total impedance Zt seen into the test port of the tuner is: $Zt=\Sigma Zi+50\Omega$ (eq 3); we add 50Ω, because s-parameter calculation imposes such a termination, if we intend to convert Z-parameters into s-parameters using the relation: $S11=\Gamma=(Z-Zo)/(Z+Zo)$; from (eq 3), we can calculate the interpolated or extrapolated value of any impedance Zi by simply using: Zt'=Zt+dZi/dCi*δCi (eq 4); From (eq 4) then we can calculate S11' easily.

Harmonic tuning is the capacity of a tuner to synthesize, independently, user defined impedances at two or more harmonic frequencies at the same time, if there are no frequency separators, such as filters or diplexers/triplexers (FIG. 1), in which case each harmonic spectrum component is treated in a different signal path, the impedance tuner must synthesize a number of different impedances at different frequencies simultaneously; this is a network design task, but with only limited building blocks (in this case variable capacitors). We obviously deal here with a network of multiple resonances; rational equations describing such a network are, in practice, unsolvable; the most efficient and practical way of handling the requirements of synthesizing simultaneously two or more impedances at two or more frequencies is to use an appropriate numeric trial-and-error search algorithm, which samples systematically through the billions of possible tuner settings, as described before, and finds possible tuner configurations for the requested two or more harmonic impedances (tuning).

It has to be mentioned here that the solutions the search algorithm determines are not exact. The way the search algorithm operates, is to search for "nearby" solutions by using an ERROR function. An error function is the sum of differences between the target impedances $Z_T$ and an obtained value $Z_C$ for one, two or three harmonic frequencies. Higher harmonic frequencies can also be included.

The Error Function used for this optimization task is: EF=$\Sigma\{Z_T(Fi)-Z_C(Fi)\}$, where Fi are various/harmonic frequencies, $Z_T$ are target impedances and $Z_C$ are obtained solutions of the harmonic tuning process. The sum $\Sigma$ is built over (i) which is the number of (harmonic) frequencies and the variables are the motor positions which set the capacitor values, and which are associated with s-parameters (or Z parameters) in the calfiles. When the Error Function EF reaches a minimum value, we have a solution. As in many multi-parameter optimization problems we often get several local minima and the search algorithm has to decide whether to continue searching by changing the starting values of the search, or stop and declare a solution found. Several optimum search algorithms applicable here are known in the literature [5],[8]. We used a gradient and a simplex optimization method alternatively.

The harmonic load pull tuner is used in a load pull setup, shown in FIG. 14. It comprises, in its simplest configuration, a signal source, a driver amplifier, a DUT fixture, the DUT itself, the harmonic tuner and a power meter. All instruments are remotely programmable by digital interface. Such digital interface are GPIB, serial, USB or TCP/IP are also possible. The tuner and the instruments are all remotely controlled, set and read from a system control computer, which runs appropriate software; the software processes tuner calibration and interpolation data, calculates tuner positions and sets the motors and once the impedance conditions are set, it sets the input signal power required and reads the power meter. The measured results are saved in load pull data files, which can then be plotted using contouring software or can be processed otherwise. Additional instruments, such as a source tuner, a second signal source, a remote power supply and a spectrum analyzer can be added to the setup, for additional testing; although this has been known in the art it shall not impede on the originality of the present invention.

The interpolation routines used in this preferred embodiment, as well as the calibration techniques used are deemed to be the most appropriate for the purpose of harmonic tuning; however different methods can be used for this purpose, but this shall not infer with the innovation and basic idea of the apparatus and its operation described here.

The present embodiment of this invention can easily be adapted to use other types of mechanically adjustable variable capacitors, or electrically adjustable ones, such as Varactor or high frequency Trimmer Capacitor based [9, 10], which cover higher frequencies, above 200 MHz; this shall not limit the basic idea and the overall scope of the present invention, of using a series of six or more remotely adjustable variable capacitors joined with transmission lines as building blocks of a harmonic load pull tuner.

What I claim as my invention is:

1. A calibration technique of impedance tuners comprising $N \geq 1$ tuning elements, for a number of frequencies Fi, whereby $1 \leq i \leq M$ and whereby Fi are arbitrary frequencies, including harmonic frequencies ($F_{i+1}=(i+1)*Fi$) said calibration technique comprising s-parameter measurement of said tuner using a pre-calibrated network analyzer;

said calibration comprising four steps:
a) measuring the s-parameter matrix of said tuner when all tuning elements are initialized (set to their neutral state) and saving the data in a s-parameter matrix $\{A\}$;
b) measuring the s-parameters of said tuner when each element "i" is set to a number of states, all other tuning elements remaining initialized, and saving the data in an s-parameter matrix $\{Bi\}$;
c) cascading the inverse matrix $\{A\}^{-1}$ with all matrices $\{Bi\}$, except for matrix $\{B1\}$, resulting in matrices $\{Ci\}=\{A\}^{-1}*\{Bi\}$ and $\{C1\}=\{B1\}$;
d) numerically cascading all elements (s-parameters) of all matrices $\{Ci\}$, for i=1 to N in order to obtain the total calibration matrix $\{CT\}$ of said multi-element tuner, comprising the s-parameters of said tuner for all permutations of settings of all tuning elements;
e) saving matrix $\{CT\}$ in computer memory for later use.

2. A calibration method as in claim 1 for a multi-element impedance tuner;

said tuner comprising a cascade of two tuning sections;
each said section comprising an input (test) port and an output (idle) port and three variable shunt capacitors;
each said capacitor being grounded on one terminal and inter-connected on its second terminal with the previous and next capacitor by means of coaxial cable of appropriate length, the first said cable connected to the test port and the last said cable connected to the idle port;
each capacitor being remotely adjusted using precise electrical motors, control electronics driving said motors and a control computer running control software.

3. A calibration method as in claim 1 for a multi-element impedance tuner;

said tuner comprising a cascade of three tuning sections;
each said section comprising an input (test) port and an output (idle) port and three variable shunt capacitors;
each said capacitor being grounded on one terminal and inter-connected on its second terminal with the previous and next capacitor by means of sections of coaxial cable of appropriate length, the first said cable connected to the test port and the last said cable connected to the idle port;
each capacitor being remotely adjusted using precise electrical motors, control electronics driving said motors and a control computer running control software.

4. A calibration method as in claim 1 for a multi-element impedance tuner;

said tuner comprising an input (test) port and an output (idle) port and an assembly of variable capacitors and coaxial cables connected between said ports;

said assembly comprising a cascade of six or more variable shunt capacitors connected between them using sections of coaxial transmission cable of appropriate length;

said capacitor's one terminal being grounded and the other terminal being connected to the previous and next in series capacitor using said coaxial cable, the first said cable connected to the test port and the last said cable connected to the idle port;

each capacitor being remotely controlled using precise electrical motors, control electronics driving said motors and a control computer running control software.

5. A calibration method as in claim 1 for a multi-element impedance tuner;

said tuner comprising an input (test) port and an output (idle) port and an assembly of variable capacitors and coaxial cables connected between said ports;

said assembly comprising a cascade of nine variable shunt capacitors connected between them using sections of coaxial transmission cable of appropriate length;

said capacitor's one terminal being grounded and the other terminal being connected to the previous and next in series capacitor using sections of coaxial cable, the first said cable connected to the test port and the last said cable connected to the idle port;

each capacitor being remotely controlled using precise electrical motors, control electronics driving said motors and a control computer running control software.

6. A calibration method as in claim 2 or 3 or 4 or 5 for multi-element impedance tuners, whereby said electrical tuner motors are stepper motors.

7. A calibration method as in claim 2 or 3 or 5 or 5 for multi-element impedance tuners, whereby the lengths of the sections of coaxial cable between capacitors are determined such as to allow maximum coverage of the Smith chart over a maximum frequency range.

8. A calibration method as in claim 2 or 3 or 4 or 5 for multi-element impedance tuners, whereby the lengths of the sections of coaxial cable between capacitors are determined such as to allow maximum coverage of the Smith chart over distinct frequency bands.

9. A calibration technique of impedance tuners comprising $N \geq 1$ tuning elements, for a number of frequencies Fi, whereby $1 \leq i \leq M$ and whereby Fi are arbitrary frequencies, including harmonic frequencies ($F_{i+1}=(i+1)*Fi$) said calibration technique comprising s-parameter measurement of said tuner using network analyzer in six steps as follows:

a) calibrate the network analyzer on a reference plane at the test ports of the RF cables and save the calibration in a calset-1;

b) connect the test port of said tuner, with all tuning elements initialized (set to their neutral state), with port 1 of said network analyzer and calibrate said network analyzer between the idle port of said (initialized) tuner and port 2 of said network analyzer, and save the calibration in a calset-2;

c) load calset-1 in the network analyzer memory and measure the s-parameter matrix of said tuner, when all tuning elements are initialized and only the first element is activated and set to a number of states, and save the data in a s-parameter matrix {A1};

d) load calset-2 in the network analyzer memory and measure the s-parameters of said tuner when each element "i", for i=2 to N, is set to a number of states, all other tuning elements remaining initialized, and save the data in a s-parameter matrix {Ai};

e) numerically cascade all matrices {Ai}, for i=1 to N, resulting in total tuner s-parameter calibration matrix {AT} of said multi-element tuner comprising the s-parameters of said tuner for all permutations of settings of all tuning elements;

f) saving matrix {AT} in computer memory for later use.

10. A calibration method as in claim 9 for a multi-element impedance tuner;

said tuner comprising a cascade of two tuning sections, each said section comprising an input (test) port and an output (idle) port and three variable shunt capacitors;

each said capacitor being grounded on one terminal and inter-connected on its second terminal with the previous and next capacitor by means of coaxial cable of appropriate length, the first said cable connected to the test port and the last said cable connected to the idle port;

each capacitor being remotely adjusted using precise electrical motors, control electronics driving said motors and a control computer running control software.

11. A calibration method as in claim 9 for a multi-element impedance tuner;

said tuner comprising a cascade of three tuning sections, each said section comprising an input (test) port and an output (idle) port and three variable shunt capacitors;

each said capacitor being grounded on one terminal and inter-connected on its second terminal with the previous and next capacitor by means of sections of coaxial cable of appropriate length, the first said cable connected to the test port and the last said cable connected to the idle port;

each capacitor being remotely adjusted using precise electrical motors, control electronics driving said motors and a control computer running control software.

12. A calibration method as in claim 9 for a multi-element impedance tuner;

said tuner comprising an input (test) port and an output (idle) port and an assembly of variable capacitors and coaxial cables connected between said ports;

said assembly comprising a cascade of six or more variable shunt capacitors connected between them using sections of coaxial transmission cable of appropriate length;

said capacitor's one terminal being grounded and the other terminal being connected to the previous and next in series capacitor using said coaxial cable, the first said cable connected to the test port and the last said cable connected to the idle port;

each capacitor being remotely controlled using precise electrical motors, control electronics driving said motors and a control computer running control software.

13. A calibration method as in claim 9 for a multi-element impedance tuner;

said tuner comprising an input (test) port and an output (idle) port and an assembly of variable capacitors and coaxial cables connected between said ports;

said assembly comprising a cascade of nine variable shunt capacitors connected between them using sections of coaxial transmission cable of appropriate length;

said capacitor's one terminal being grounded and the other terminal being connected to the previous and next in series capacitor using sections of coaxial cable, the first said cable connected to the test port and the last said cable connected to the idle port;

each capacitor being remotely controlled using precise electrical motors, control electronics driving said motors and a control computer running control software.

14. A calibration method as in claim 10 or 11 or 12 or 13 for multi-element impedance tuners, whereby said electrical motors are stepper motors.

15. A calibration method as in claim 10 or 11 or 12 or 13 for multi-element impedance tuners, whereby the lengths of the sections of coaxial cable between capacitors are determined such as to allow maximum coverage of the Smith chart over a maximum frequency range.

16. A calibration method as in claim 10 or 11 or 12 or 13 for multi-element impedance tuners, whereby the lengths of the sections of coaxial cable between capacitors are determined such as to allow maximum coverage of the Smith chart over distinct frequency bands.

\* \* \* \* \*